310-335 SR
4/5/88 XR 4,734,963

United States Patent [19]
Ishiyama

[11] Patent Number: 4,734,963
[45] Date of Patent: Apr. 5, 1988

[54] METHOD OF MANUFACTURING A CURVILINEAR ARRAY OF ULTRASONIC TRANSDUCERS

[75] Inventor: Kazufumi Ishiyama, Ootawara, Japan

[73] Assignee: Kabushiki Kaisha Toshiba, Kawasaki, Japan

[21] Appl. No.: 930,104

[22] Filed: Nov. 13, 1986

Related U.S. Application Data

[62] Division of Ser. No. 679,058, Dec. 6, 1984, abandoned.

[30] Foreign Application Priority Data

Dec. 8, 1983 [JP] Japan ................................ 58-230670
Jun. 6, 1984 [JP] Japan ................................ 59-114639

[51] Int. Cl.⁴ ................................ H01L 41/22
[52] U.S. Cl. ................................ 29/25.35; 310/327; 310/335; 310/365
[58] Field of Search ............... 29/25.35; 310/800, 334, 310/335, 357-359, 320, 365

[56] References Cited

U.S. PATENT DOCUMENTS

| | | | |
|---|---|---|---|
| 3,496,617 | 2/1970 | Cook et al. | 29/25.35 |
| 3,952,387 | 4/1976 | Iinuma et al. | 29/25.35 |
| 4,404,489 | 9/1983 | Lavson, III et al. | 29/25.35 X |

FOREIGN PATENT DOCUMENTS

| | | | |
|---|---|---|---|
| 0149615 | 11/1979 | Japan | 29/25.35 |
| 0134596 | 10/1980 | Japan | 29/25.35 |

*Primary Examiner*—Carl E. Hall
*Attorney, Agent, or Firm*—Oblon, Fisher, Spivak, McClelland & Maier

[57] ABSTRACT

A curvilinear array of ultrasonic transducers primarily for use in a medical diagnostic apparatus by which divergent ultrasonic beams are transmitted without resorting to sector scanning techniques to steer the ultrasonic beam. The curvilinear array of ultrasonic transducers includes a flexible transducer assembly bonded to a curvilinear surface of backing base. The flexible transducer assembly includes a flexible backing plate and an array of ultrasonic transducers elements disposed on the flexible backing. The array is formed of a transducer plate having grooves cut through to the flexible backing plate to isolate the transducer elements.

4 Claims, 3 Drawing Sheets

METHOD OF MANUFACTURING A CURVILINEAR ARRAY OF ULTRASONIC TRANSDUCERS

This is a division, of application Ser. No. 679,058, filed Dec. 6, 1984, now abandoned.

BACKGROUND OF THE INVENTION

1. Field of the Invention

This invention relates to an array of ultrasonic transducers for use in a medical imaging apparatus. More specifically, the invention relates to a curvilinear, i.e., convex or concave, array of ultrasonic transducer elements which performs sector scanning of ultrasonic beams.

2. Description of the Prior Art

An array of ultrasonic transducers is used in a ultrasonic apparatus to observe the internal organs of a patient. Such an apparatus provides successive images at a rapid rate, in "real time", such that an observer can see movements of continuous motion.

A curvilinear array of ultrasonic transducers is disclosed in, for example, U.S. Pat. Nos. 4,344,327; 4,409,982; and 4,281,550. The former two patents disclose convex arrays and the letter patent discloses a concave array.

An advantage of these curvilinear arrays is the ability to perform sector scanning without a need for electronic sector scanning techniques to steer the ultrasonic beams over a large angle. In electronic sector scanning, plural ultrasonic transducer elements are linearly arrayed on a common plane. All the elements are excited at a different timing relation to phase the wave fronts of the respective ultrasonic waves to define a steered beam direction. But such excitation is liable to generate a side-lobe beam in addition to the main beam. The side-lobe beam gives the image an artifact because information obtained by the side-lobe beam is also interpreted as that of the main beam.

The curvilinear array of transducer elements performs the sector scanning of ultrasonic beams without exciting the transducer elements with different timing relations. Thus, an ultrasonic imaging apparatus using the curvilinear array does not need delay time circuits to give elements different timing relations to steer beams. Further, it provides a wider viewed image at more distant regions than obtained with conventional electric linear scanning.

It is, however, more difficult to assemble the curvilinear array relative to that of the non-curved, linear array because the piezoelectric ceramic plate for the ultrasonic transducer is rigid and is not itself flexible.

Therefore, a curved piezoelectric ceramic plate is fabricated by grinding a block of piezoelectric ceramic in a desired curvilinear shape. The thickness of the plate forming the array is about 0.3 mm to transmit 5 MHz ultrasonic beams. So it is not easy to grind the block to produce such a thin curved piezoelectric ceramic plate, especially of small radius. It is also difficult to divide the curved ceramic plate into the plural elements as compared with a non-curved one.

U.S. Pat. No. 4,281,550 discloses a concave array, wherein copper electrodes are bonded to the front and rear major surfaces of the plate with a silver bearing epoxy resin. A flexible matching window (layer) is then cast directly on the front electrode. A series of paralleled grooves are then cut through the rear electrode. The grooved ceramic plate is formed around a semi-cylindrical mandrel by cracking via each groove to produce a curved array of separate, electroded transducer elements.

But the fabrication shown in U.S. Pat. No. 4,281,550 is limited to a concave array because the grooved array can not be bent towards the grooved surface.

SUMMARY OF THE INVENTION

Accordingly, it is an object of the present invention to provide a concave or convex linear array of ultrasonic transducers whose radius is not limited.

It is another object of the present invention to provide a concave or convex linear array of a simple fabrication without need for a curvilinear piezoelectric ceramic plate.

In accordance with this invention, a non-curved transducer plate is bonded to a thin flexible backing plate. The transducer plate is diced through to the backing plate and divided into series of parallel transducer elements. The backing plate having the paralleled transducer elements mounted thereon is then conformed to another concave or convex curved backing base.

In accordance with this invention, a flexible printed circuit (FPC) board which has lead wire patterns to supply drive pulses to individual elements and to acquire from the respective elements return signals is connected to one edge of the transducer plate prior to cutting of the transducer plate. The connection part of the FPC board and the transducer plate is cut to bend the flexible backing plate on which the transducer elements are mounted to isolate the transducer elements. Several slits are then cut to divide the FPC board into several groups. Opposite ends of the FPC board groups not connected to the transducer elements are connected to a respective connector part. All groups of the slitted FPC board are bent near the connection part at a right angle.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
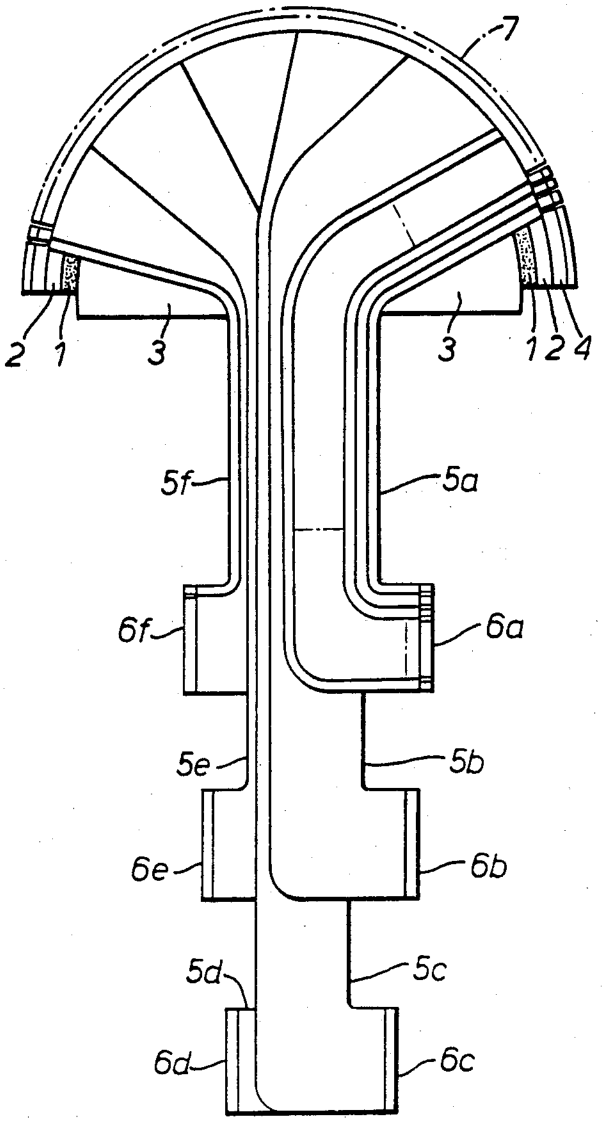
FIG. 1 is a side view of a curvilinear array of ultrasonic transducers of the present invention.

Referring now to the drawings, wherein like reference numerals designate identical or corresponding parts throughout the several views, and more particularly to FIG. 1 thereof, shown therein is a convex array of ultrasonic transducers in accordance with the teachings of the present invention. A semi-cylindrical backing base 3 which absorbs ultrasonic waves is made of a ferrite rubber whose acoustic impedance is about $5.2\times10^6$ kg/m$^2$ sec. Bent along the semi-cylindrical surface of the backing base 3 is a backing plate 2 which has the same acoustic impedance and is made of the same material as the backing base 3. Plate 2 adheres to the backing base 3 by means of an adhesive layer 1 like a epoxy resin containing heavy metal powder for example, ferrite, zinc and so on, to match the acoustic impedance of the adhesive layer 1 with the backing base 3 and the backing plate 2. This matching of the acoustic impedance contributes to preventing ultrasonic wave propagating towards the backing base 3 from being reflected at such a connection layer.

A large number such as e.g., 128, divided transducer elements 4 are mounted on the backing plate 2. One edge of each transducer element is connected to a terminal of a respective lead line L formed on FPC boards 5*a*–5*f*. The FPC boards have, for example, 8 to 22 lead lines L thereon. The opposite terminals of the lead lines L on FPC boards 5*a*–5*f* have connection parts 6*a*–6*f* with respective connecting leads (not shown). Drive pulses to excite the transducer elements 2 and return signals received thereby are communicated through these lead lines L.

In the same way as connections are made by means of the FPC boards 5*a*–5*f*, ground lines (not shown) are commonly connected to the other edges of transducer elements 4. The drive pulses are supplied to the elements 4 from the electrode lines L through the ground electrode lines.

On the surface of the elements 4 are mounted first matching layers 7 which are divided with the elements 4. The first matching layers 7 are made of, for example, alumina epoxy resin with a thickness of about 0.14 mm at 5 MHz. A second matching layer (not shown), like a polyester film, is provided covering over the surfaces of these first matching layers 7. The thickness of the second matching layer is about 0.10 mm at 5 MHz. These first and second matching layers compensate for a great difference of acoustic impedance between the transducer elements and a patient so as to avoid reflection in a connection area between the patient and the transducer elements.

Further, a semi-cylindrical acoustic lens (not shown), which is curved orthogonal to the array direction of the transducer elements 4, is mounted on the second matching layer to focus ultrasonic beams in a direction perpendicular to the array direction.

The operating of this convex transducer array of the present embodiment is similar to conventional electrical linear scanning. A plurality of adjacent elements are excited to transmit ultrasonic beams and receive the resulting return echoes. These excited elements in the array are incrementally shifted along the convex array, one element at a time to effect scanning. A well known electronic ultrasonic beam focussing is useful for focussing beams in the array direction to compensate for the divergence of beams where excited transducer elements are positioned on the convex array.

Figure 2:
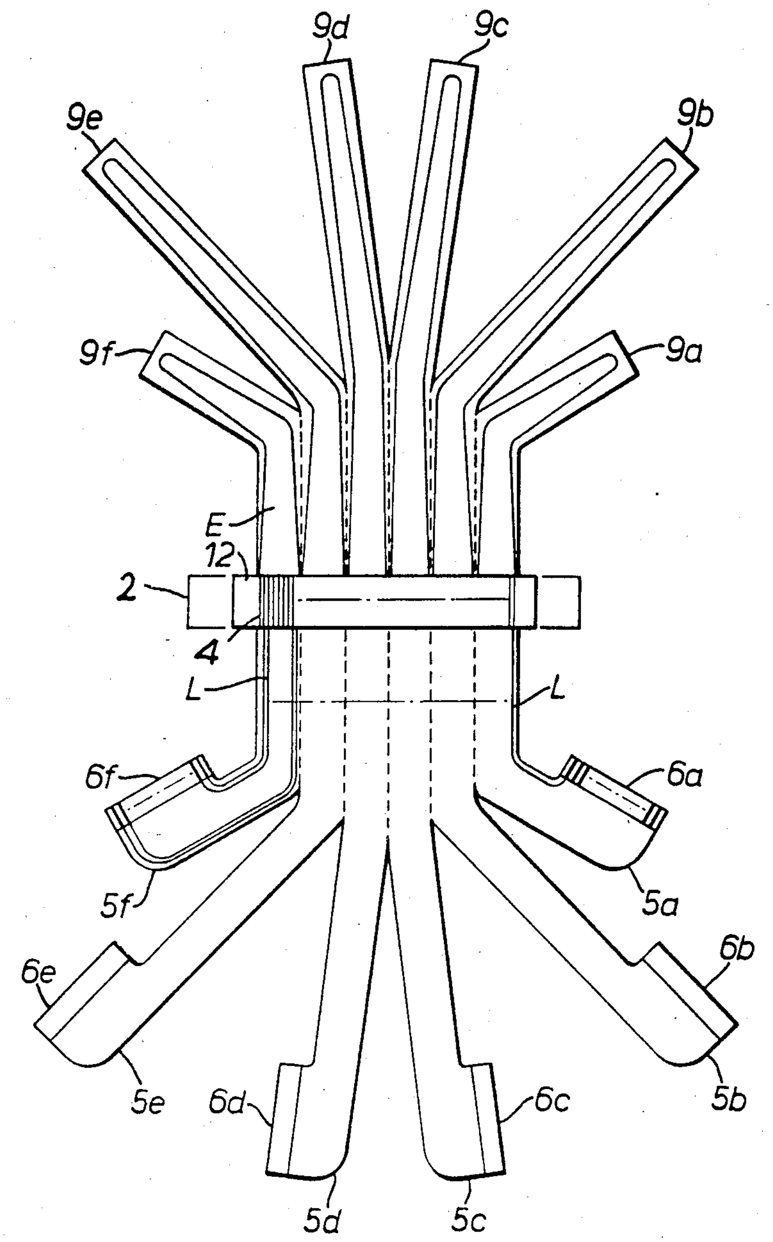
FIG. 2 is a top view illustrating a stage in the production of the array of FIG. 1.
Figure 3:
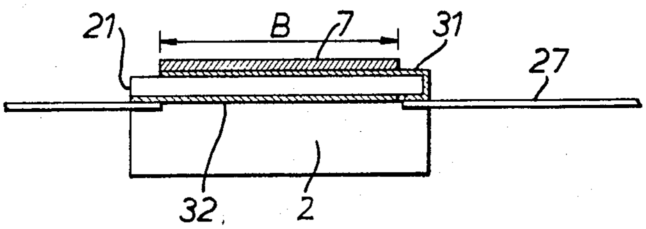
FIG. 3 is a cross-sectional view along line A-A' of FIG. 2.

FIGS. 2 and 3 illustrate first steps in a preferred method for manufacturing the transducer array. The array is formed from a single plate 21 of piezoelectric ceramic whose thickness is about 0.3 mm at a 4 MHz ultrasonic wave.

Electrode layers 31, 32 are bonded to the front and rear surfaces of the plate 21 as shown in FIG. 3. The rear electrode layer 32 and the front electrode layer 31 are dimensioned and arranged on the plate 21 so as to define an exciting region B located symmetrically to the center of the plate 21. An edge of rear electrode 32 is soldered to the lead lines L of the FPC board 5. A part of front electrode 31 extends around the plate 21 to the rear surface and is soldered to the ground lines E on another FPC board 27.

The flexible backing plate 2 is bonded to the rear electrode 32. The thickness of the flexible backing plate 2 is about 1.2 mm in this embodiment. The flexible backing plate 2 is required to be thin enough to prevent it from warping, except for the curvilinear surface of the backing base 3. Also it is required to be thick enough not to be cut through completely when the piezoelectric ceramic plate 21 is diced to produce the array of transducer elements.

The first matching layer 7 is bonded to the front electrode 31. The first matching layer 7 usually has higher acoustic impedance than the second matching layer and the patient, and less than that of the piezoelectric ceramic of plate 21. The first matching layer 7 is more rigid than the second matching layer. Dividing the first matching layer in addition to dividing the elements increases isolation and decreases crosstalk between the elements. Thus, a vibration excited in a transducer element does not propagate to an adjacent transducer element through the first matching layer 7. The second matching layer which covers over the first matching layer 7 is elastic enough to absorb such a vibration.

In the second step of manufacturing, the matching layer and the plate 21 of piezoelectric ceramic are cut between lead lines L at least through to the flexible backing plate 3. For example, 64 to 128 transducer elements 4 are thereby produced. The edges of transducer elements 4 are connected respectively to lead line L and common ground line E.

In a preferred embodiment, each transducer element is divided into a plurality of sub-elements which are electrically connected in common.

Figure 4A:
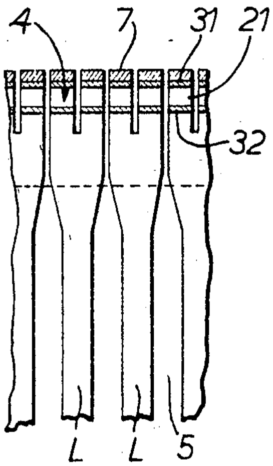
FIGS. 4*a* and 4*b* are enlarged cross-sectional views illustrating a stage in the production of the array of FIG. 1.
Figure 4B:
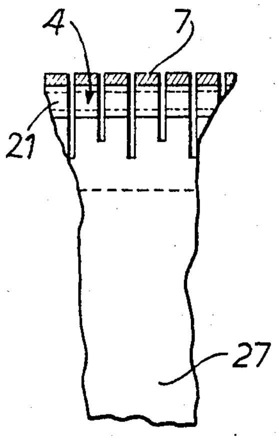

FIGS. 4*a* and 4*b* illustrates this preferred embodiment. The transducer assembly assembled by the first steps, as shown in FIGS. 2 and 3, is temporarily fixed to a rigid base (not shown) which is as wide as the piezoelectric ceramic of plate 21. Both FPC boards are bent at right angle around the connection parts to the plate 21. Then, a diamond saw is used to cut the piezoelectric ceramic of plate 21 over the first matching layer 7, as shown in FIGS. 4*a* and 4*b*. The diamond saw alternately makes 0.6 mm and 0.2 mm depth grooves in the flexible backing plate 2 and FPC boards 5,27. The deeper (0.6 mm) grooves between the adjacent elements 4 or the adjacent lead lines L divide the piezoelectric ceramic of plate 21 sandwiched between the electrode layers 31 and 32 to produce the transducer elements. The other grooves between the deeper grooves produce the transducer sub-elements. The two sub-elements from the one element are electrically connected to the identical lead line L as shown in FIG. 4*a*. These grooves, however, do not produce electrical isolation of the ground line E as shown in FIG. 4*b*.

The crosstalk between the elements through the flexible backing plate 3 is reduced by the grooves between sub-elements. Further, the flexible backing plate 3 becomes more flexible due to these grooves.

The backing plate 2 bonded thereto the rigid ceramic plate 21 becomes flexible by cutting and dividing of the ceramic plate 21. The so-processed flexible plate 21 bonding transducer elements 4 can then be shaped in convex or concave form.

The FPC boards on which lead lines L and ground lines E are formed are divided into the several slips to 5a–5f and 9a–9f. The tips of slips 5a–5f and 9a–9f are divergent as shown in FIG. 2 to bind them easily after they are turned back as shown in FIG. 1. The width of each of slips 5a–5f and 9a–9f becomes narrow when the radius of the curvilinear is small.

In the third step of this manufacturing method, this flexible backing plate 2 is bonded to the curved surface of the convex backing base 3 with the epoxy resin 1. A muddy ferrite rubber may be directly cast into the convex plate 21 to form the convex backing base 3 instead of using the epoxy resin 1.

In the fourth step of this manufacturing method, the second matching layer (not shown) and acoustic lens are mounted on the first matching layer 7.

According to this method of manufacturing, a convex array of transducer elements having a small radius, e.g., about 25 mm, can be provided.

These steps are also applicable to a concave array of ultrasonic transducer elements. In the concave array, the backing base 3 has a concave surface instead of a convex surface. The grooves are as wide as the tops of elements so that the elements do not contact.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a convex array of ultrasonic transducers, comprising the following steps in the stated order:

bonding a flexible printed circuit board having electrode lead patterns to a portion of a rear surface of a flat transducer plate;

bonding said rear surface of said transducer plate having said electrode lead patterns bonded thereto to one side of a flexible backing plate to sandwich said flexible print cirucit board between said flexible backing plate and said transducer plate;

cutting through said transducer plate and said flexible printed circuit board at least through to the flexible backing plate between said electrode lead patterns to produce an array of transducer elements; and bending said flexible backing plate around a convex surface of a backing base and bonding the other side of said flexible backing plate to said convex surface.

2. The method according to claim 1, comprising:

dividing said flexible printed circuit board into a plurality of separated slips after said cutting step; and bending said slips of said flexible printed circuit board around a side surface of said backing plate in a direction generally perpendicular to said transducer elements.

3. The method according to claim 1, wherein the other side of said flexible backing plate is temporarily fixed to a flat rigid base while said transducer plate is cut.

4. The method according to claim 1, further comprising bonding a first matching layer to a front surface of said transducer plate before cutting said transducer plate.

* * * * *

UNITED STATES PATENT AND TRADEMARK OFFICE
CERTIFICATE OF CORRECTION

PATENT NO. : 4,734,963

DATED : Apr. 5, 1988

INVENTOR(S) : Kazufumi ISHIYAMA

It is certified that error appears in the above-identified patent and that said Letters Patent is hereby corrected as shown below:

ON THE TITLE PAGE:

The second listing under Foreign Application Priority Data should read as follows:

-- Jun. 6, 1984 [JP] Japan .............. 59-114638 --

Signed and Sealed this

Sixteenth Day of August, 1988

*Attest:*

DONALD J. QUIGG

*Attesting Officer* *Commissioner of Patents and Trademarks*